United States Patent [19]

Gaensslen et al.

[11] 3,840,888

[45] Oct. 8, 1974

[54] COMPLEMENTARY MOSFET DEVICE STRUCTURE

[75] Inventors: Fritz H. Gaensslen, Yorktown Heights; Lewis M. Terman, South Salem, both of N.Y.

[73] Assignee: International Business Machines Corporation, Armonk, N.Y.

[22] Filed: Dec. 30, 1969

[21] Appl. No.: 889,278

[52] U.S. Cl. .......................... 357/42, 357/23, 357/58

[51] Int. Cl. .......................... H01l 19/00

[58] Field of Search ............ 317/235; 307/304, 205; 320/35

[56] References Cited

UNITED STATES PATENTS

| | | | |
|---|---|---|---|
| 2,790,037 | 4/1957 | Shockley | 317/235 |
| 3,473,032 | 10/1969 | Lehovec | 317/235 |
| 3,493,824 | 2/1970 | Richman et al. | 317/235 |

*Primary Examiner*—Jerry D. Craig

*Attorney, Agent, or Firm*—Thomas J. Kilgannon, Jr.; Victor Siber

[57] ABSTRACT

A complementary field effect device which incorporates pairs of source and drain regions and a common channel region is disclosed. One of the field effect transistors which shares the common channel region is an n-channel device while the other is a p-channel device. When these devices are operated, one device is in the ON condition while the other device is in the substantially OFF condition. The structure may be fabricated by known integrated circuit techniques and, as a result of its unique configuration, is useful in logical operations which require complementary devices.

8 Claims, 2 Drawing Figures

INVENTOR
FRITZ H. GAENSSLEN
LEWIS M. TERMAN

BY Thomas J. Kilgannon Jr.
ATTORNEY

COMPLEMENTARY MOSFET DEVICE STRUCTURE

BACKGROUND OF THE INVENTION

1. Field of the Invention

This invention relates generally to field effect transistor device. More specifically, it relates to field effect transistors of the complementary type wherein at least two complementary transistors utilize a common channel region. The structure basically consists of n and p conductivity type diffusion regions in a semiconductor substrate which share a common channel region and are actuated by a common gate. Application of the proper polarity and magnitude of voltage causes the formation of either an n or a p conductivity type conduction channel under the gate, and may cause depletion and pinching-off of the n-channel or p-channel device, resulting in one of the devices assuming a conducting condition while the other assumes a non-conducting condition. The characteristics of the device depend upon the doping under the gate. If the region under the gate is doped p-type, (assuming no induced surface charge) the p-channel device is depletion mode and the n-channel is enhancement mode. If, on the other hand, the region under the gate is doped n-type, the n-channel device is depletion mode and the p-channel device is enhancement mode. If the region under the gate is intrinsic semiconductor material or compensated semiconductor material, both n and p-channel devices are enhancement mode devices. Complementary circuits may be fabricated by simply providing the proper interconnections. The complementary field effect transistor structure of the present application has the advantage of simple fabrication in that starting with substantially intrinsic material, only one p-type and one n-type diffusion are required. Utilization of the common channel region offers the advantage of area reduction over other known complementary devices. In addition, a flexibility is offered because both enhancement and depletion mode devices can be made.

2. Description of the Prior Art

Complementary field effect devices are of course well known. Prior art arrangements, however, incorporate separate channel regions for a p-channel field effect transistor and for an n-channel field effect transistor. In one known arrangement, a lightly doped substrate of p-type conductivity is provided and separate p-channel and n-channel devices are formed by first diffusing n-type dopants into selected areas of the substrate and then diffusing p-type dopants into other selected areas of the substrate. This arrangement is, in reality, no different from any other field effect transistor arrangement except that both p-channel and n-channel devices are formed on the same substrate. By applying appropriate contacts and gate metallizations and interconnections, the complementary devices may be interconnected in a fashion desired. The device of the present application differs from the prior art teaching in that while separate p and n-type diffusions are made, the resulting diffusions are clustered about a common channel region and are activated by a single gate electrode disposed over the common channel area.

Another known arrangement utilizes multiple channels, one of p-conductivity and one of n-conductivity type, separated one from the other by a pn junction. In each of these arrangements, the current channel is generally defined by a volume between the boundary of a depletion layer and a free surface of the body. The device is essentially a pair of thin semiconductor channels separated by a pn junction and having electrodes at each end of both channels to provide a four-terminal element. In this arrangement, there is no common channel region.

SUMMARY OF THE INVENTION

The present invention, in its broadest aspect, comprises a complementary field effect structure which includes at least two transistors one of which has source and drain regions of opposite conductivity type to the source and drain regions of the other and a common channel region. The complementary field effect device includes a common gate electrode which is disposed over the common channel region. The devices of the complementary field effect structure may be both enhancement mode devices or, one device may be enhancement mode while the other is a depletion mode device. The common channel region may be of lightly doped n or p-conductivity type semiconductor material such that it presents a high resistivity to the flow of current. The common channel region is preferably intrinsic, that is, a semiconductor material containing neither p or n-type dopants of any sort. As a practical matter, a semiconductor material defined as intrinsic is attainable only with great difficuty, if at all, and, at this time, it does not represent a very practical embodiment. Optimum performance, however, would be achieved in the practice of the present invention if a semiconductor material of the intrinsic variety were used. An equally desirable but achievable condition is provided by making the common channel region of compensated semiconductor material. This material is provided by introducing dopants of opposite conductivity type in sufficient amounts to that of the as grown crystal, thus, rendering the semiconductor material of neutral conductivity type. Use of either the intrinsic or compensated channel region results in both devices being enhancement mode or normally nonconducting devices.

In a preferred practical arrangement, (because the common channel is either lightly p or n-conductivity type) one of the field effect devices of the complementary arrangement is an enhancement mode device, that is, it is normally OFF with zero voltage on its gate, while the other is a depletion mode device, that is, a device which is normally ON with zero volts on its gate.

Each of the field effect transistors may be connected in logic arrangements which permit one of the devices to be in the ON or conducting condition while the other device is in the OFF or nonconducting condition. Thus, while the source and drain regions of each of the devices are not necessarily interconnected, it should be appreciated that the conducting or nonconducting state of the devices sharing the common channel is determined by a signal on a common gate electrode. Other applications permit the direct interconnection of the devices. For example, the present arrangement is particularly useful in an inverter regime where normally a single signal turns one device substantially OFF while the other device is turned ON. The utilization of the common channel region obviously reduces the area requirements for such devices resulting in higher density and relative ease of interconnection compared to prior art devices.

It is, therefore, an object of this invention to provide a complementary semiconductor device which has reduced semiconductor chip area requirements; can be manufactured by simple known fabrication techniques; and provides both high-density arrangements and simple interconnections to provide useful complementary circuit arrangements.

The foregoing and other objects, features and advantages of the present invention will be apparent from the following more particular description of a preferred embodiment of the invention as illustrated in the accompanying drawings.

DESCRIPTION OF A PREFERRED EMBODIMENT

Figure 1:
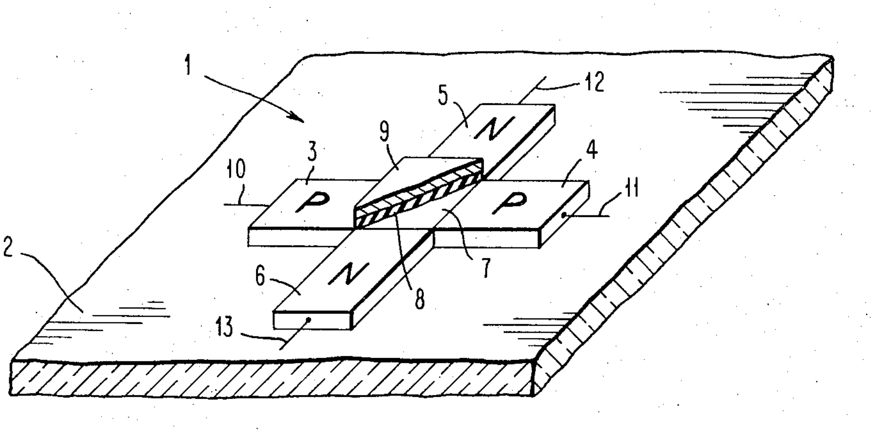
FIG. 1 is a perspective view of a complementary field effect structure in the integrated circuit environment showing two field effect transistors which share a common channel region. The source and drain regions of one of the field effect transistors are of opposite conductivity type to the source and drain regions of the other of the field effect transistors.

Referring now to FIG. 1, there is shown a complementary transistor device 1 disposed atop an insulating substrate 2. Substrate 2 may be any insulating material which will permit the deposition of single crystal layers of a semiconductor material such as germanium, silicon or gallium arsenide. An example of a suitable insulating substrate for use with silicon is sapphire. Complementary transistor device 1 consists of p-conductivity type regions 3 and 4 and n-conductivity type regions 5 and 6, all of which are joined to or meet at a common channel region 7. Channel region 7 is made of a semiconductor material which is the same as that utilized for the p and n-conductivity type regions and may, itself, be lightly doped p or n-conductivity type material or it may be undoped or intrinsic semiconductor material. Channel 7 may also be compensated semiconductor material which exhibits a substantially neutral conductivity. An insulating layer 8 which may be a suitable metal oxide such as silicon dioxide or aluminum oxide or a nitride such as silicon nitride is shown in FIG. 1 formed over the channel region 7. Insulating layer 8 is shown partially cut away in FIG. 1 to expose channel region 7 so that the relationship of the p and n-conductivity type regions relative to channel region 7 is clear. A gate electrode 9 is formed on top of insulating layer 8 and is co-extensive with channel region 7. Electrodes 10 and 11 are shown connected to p-conductivity regions 3 and 4, respectively and electrodes 12 and 13 are shown connected to n-conductivity type regions 5 and 6, respectively. In actual practice, p and n-conductivity type region 3, 4, and 5, 6, respectively, would be covered with a thick layer of silicon dioxide or silicon nitride to protect and passivate these regions. Also, electrodes 10 – 13 would be formed upon the surface of the thick dielectric layer and penetrate it at appropriate points to form ohmic contacts with the underlying semiconductor material. A connection would be made in like manner to gate electrode 9.

Figure 2:
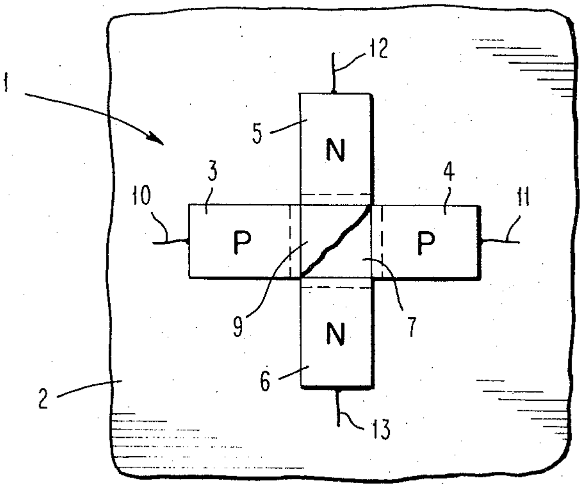
FIG. 2 is a top view of the arrangement of FIG. 1 showing the common channel region and the common gate electrode.

Considering now FIG. 2 and assuming channel region 7 to be formed of intrinsic or undoped silicon for purposes of explanation, both devices, one consisting of p-conductivity regions 3, 4 and channel region 7, and the other consisting of n-conductivity type regions 5, 6 and channel region 7, would be nonconducting with zero volts relative to their respective sources on their common gate 9 and could be characterized as enhancement mode devices.

By applying a sufficient positive voltage on the common gate 9, the n-channel device consisting of n-conductivity type regions 5, 6 and channel region 7 of intrinsic or undoped silicon, is rendered conductive. The application of the positive voltage attracts electrons to form an n-channel underneath gate 9, permitting current flow between the n-conductivity type regions 5 and 6. On the other hand, by applying a sufficient negative voltage on the common gate 9, the p-channel device consisting of p-conductivity type regions 3, 4 and channel region 7 of intrinsic or undoped silicon, is rendered conductive. The application of the negative voltage attracts holes to form a p-channel underneath gate 9 and current flows between the p-conductivity type regions 3, 4.

As indicated hereinabove, the attainment of intrinsic type material is obtainable only with great difficulty, if at all, and, as a practical matter, channel region 7 will be either slightly n-conductivity type or slightly p-conductivity type. Where channel region is of lightly doped p-conductivity type material, the transistor consisting of p-conductivity type regions 3, 4 and channel 7, may be considered a depletion mode device, that is, normally conducting with zero voltage with respect to its source on its gate. The field effect transistor consisting of n-conductivity type regions 5, 6 and channel 7 may be considered an enhancement mode device, that is, normally nonconducting with zero voltage with respect to its source on its gate. Where channel region 7 is slightly doped n-conductivity type material, the field effect transistor consisting of n-conductivity type regions 5, 6 and region 7 may be considered a depletion mode device, that is, normally conducting with zero volts with respect to its source on its gate. The field effect transistor consisting of p-conductivity type regions 3, 4 and channel region 7 may be considered an enhancement mode device, that is, normally nonconducting with zero voltage with respect to its source on its gate.

Assuming that channel region 7 is slightly p-conductivity type, the field effect transistor consisting of p-conductivity type regions 3, 4 and channel region 7 would be a depletion mode device with the zero voltage on its gate, relative to its source. Current flow could exist as a result of the p-conductivity channel 7 between p-conductivity regions 3, 4. At the same time, however, a field effect transistor consisting of n-conductivity type regions 5, 6 and slightly p-conductivity type channel region 7 is present. With zero voltage on its gate relative to its source, this device would be normally nonconducting (i.e., enhancement mode) as a result of the slightly p-conductivity type channel 7 between n-conductivity type regions 5, 6. Assuming further that the depletion mode device consisting of p-conductivity type regions 3, 4 and channel region 7 has a negative voltage on its drain, and that the enhancement mode device has a positive voltage on its drain, the application of a positive voltage to the common gate 9 turns the depletion mode device consisting of p-conductivity type regions 3, 4 and channel region 7 substantially OFF and the enhancement mode device consisting of n-conductivity regions 5, 6 and channel region 7 ON. The application of the positive voltage converts the surface of the slightly p-conductivity type channel 7 to n-conductivity type by attracting electrons to the surface, interconnecting the n-conductivity type regions 5, 6 and, in effect, disconnecting the p-conductivity type regions 3, 4. Where channel region 7 is slightly n-conductivity type, the reasoning given hereinabove in analagous when a negative voltage (in conjunction with other appropriate potentials on source and drain electrodes) is applied to the common gate 9.

From the foregoing, it should be clear that depending on the doping of the channel region 7, normally ON or normally OFF field effect transistors may be obtained which, again depending upon the conductivity type of channel region 7, may be switched from the conducting state to the nonconducting state and vice versa by the application of the appropriate voltage polarities to gate 9 of FIG. 1. The turning off of one field effect transistor and the turning on of the other field effect transistor occur substantially simultaneously but the actual time of occurrence is a function of the threshold voltage of each of the devices, their transconductances and the voltages applied to their sources and drains.

The structure of FIGS. 1 and 2 may be fabricated in the following manner. A substantially flat substrate 2 of sapphire or other appropriate material is introduced into an epitaxial deposition system and a layer of silicon is epitaxially deposited over the entire surface of substrate 2. Epitaxial deposition of silicon may be obtained using techniques well known to those skilled in the epitaxial deposition art. The hydrogen reduction of $SiCl_4$, for example, is one well known technique. Once this deposition is carried out, a layer of silicon dioxide is thermally grown on the surface of the epitaxially deposited layer of silicon. Using well-known photolithographic and etching techniques, a cruciform pattern or other desired pattern of semiconductor material is produced on the surface of substrate 2. A coating of silicon dioxide is again thermally grown to completely cover all portions of the cruciform pattern. Again using well-known photolithographic techniques, silicon dioxide is removed from two opposing extremities of the cruciform pattern. A diffusion step which introduces p-type dopants into the exposed semiconductor material is then carried out. Suitable p-type dopants are boron, aluminum or gallium. After the diffusion step, silicon dioxide is reformed on the surface of the p-doped semiconductor material. Once again, using well-known photolithographic techniques, apertures are opened in the remaining two extremities of the curciform pattern. A diffusion step which introduces n-type dopants into the exposed semiconductor region is then carried out. Suitable n-type dopants are phosphorous, arsenic, and antimony. Again, a protective coating of silicon dioxide is reformed on the surface of the n-diffused regions. After the diffusions have been carried out, the oxide over the undoped channel portion is removed and regrown thermally to form a thin gate oxide region. Metallization is then carried out in the usual manner to provide a gate over the thin oxide and to form ohmic contacts to the p and n-type diffusions and interconnections as desired. It is, of course, obvious that large number of the complementary transistor devices could be formed on insulating substrate along with other suitable devices and interconnected in an appropriate manner to form circuits or arrays which incorporate complementary transistor device 1.

In FIGS. 1 and 2, the p-diffused region 3 and the n-diffused region 5, for example, have been shown as regions which meet at the periphery of common channel region 7 for the purpose of explanation. In reality, channel region 7 could extend as shown by dotted lines 14 to eliminate the p-n junctions at the corners.

Also, it should be appreciated that common channel region 7 need not be square but can be rectangular in shape so as to provide one device with a length-to-width ratio substantially different from the length-to-width ratio of the other.

While complementary transistor device 1 has been shown as a discrete device on the surface of an insulating substrate, it should be clear that such devices may also be fabricated in the integrated circuit environment by directly diffusing pairs of source and drain regions of opposite conductivity type into a substrate of intrinsic or compensated semiconductor material. For example, a layer of semiconductor material may be epitaxially deposited on the surface of an insulating substrate. To the extent that the epitaxial layer possesses either p or n-conductivity type characteristics, a dopant of the opposite conductivity type may be introduced into the epitaxial layer to compensate for the presence of the original dopant. As a result, the material is of relatively high resistivity and may approach the characteristics of a material which is intrinsic. After formation of the compensated epitaxial layer, a layer of silicon dioxide may be thermally grown on the surface and, using well-known photolithographic techniques, a pair of apertures may be opened in the resulting layer of silicon dioxide. A diffusion step is then carried out rendering the exposed semiconductor in the apertures of a given conductivity type. The apertures are then closed by a thermal regrowth step of the silicon dioxide. Again, using well-known photolithographic techniques, another pair of apertures orthogonally disposed in relation to the original apertures are opened in the silicon dioxide layer and a diffusion step is carried out. This diffusion step introduces dopants of a conductivity type opposite to the originally introduced dopants and forms source and drain regions which are complementary to the source and drain regions formed from the initial diffusions. After reforming an oxide in the apertures, the oxide over the channel is removed by well-known photolithographic and etching techniques and regrown to form a gate oxide region.

Again, using a photolithographic and masking technique, contact openings may be made over the diffused regions. Metallization is then deposited to form the gate and source and drain contacts. This step is carried out either through a mask to form only the desired metallization or the whole surface is covered with the metal and appropriately masked and etched to define the desired metallization.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A complementary metal-oxide-semiconductor field effect device comprising:

at least two transistors each having a source and drain, a common channel region, and a common gate electrode disposed over said common channel region;

electrodes disposed in contacting relationship with said source and drain regions;

means connected to said electrodes and to said common gate for simultaneously rendering one of said at least two transistors conductive and the other nonconductive.

2. A complementary field effect device according to claim 1 wherein said transistors are enhancement mode devices.

3. A complementary field effect device according to claim 1 wherein one of said at least two transistors is an enhancement mode device and the other of said at least two transistors is a depletion mode device.

4. A complementary field effect device according to claim 1 wherein said common channel region is a high resistivity semiconductor.

5. A complementary field effect device according to claim 1 wherein said common channel region is a lightly doped region of semiconductor material.

6. A complementary field effect device according to claim 1 wherein at least one of said two transistors is an enhancement mode device.

7. A complementary field effect device according to claim 1 wherein at least one of said two transistors is a depletion mode device.

8. A complementary field effect device according to claim 1 wherein said source and drain regions of one of said at least two transistors are diffused regions of a given conductivity type and the source and drain regions of the other of said at least two transistors are diffused regions of a conductivity type opposite to said given conductivity type.

* * * * *